United States Patent [19]

Gutierrez et al.

[11] Patent Number: 5,129,962
[45] Date of Patent: Jul. 14, 1992

[54] TACKY, NO-CLEAN THERMALLY DISSIPATED SOLDERING FLUX

[75] Inventors: Barbara L. Gutierrez, Austin; Janet M. Sickler, Georgetown, both of Tex.

[73] Assignee: International Business Machines Corporation, Armonk, N.Y.

[21] Appl. No.: 781,567

[22] Filed: Oct. 22, 1991

[51] Int. Cl.⁵ .............................................. B23K 35/34
[52] U.S. Cl. ...................................... 148/23; 148/24; 148/25
[58] Field of Search .................................... 148/23–25

[56] References Cited

U.S. PATENT DOCUMENTS

| | | | |
|---|---|---|---|
| 4,168,996 | 9/1979 | Zado | 148/23 |
| 4,243,440 | 6/1981 | Arbib | 148/23 |
| 4,290,824 | 9/1981 | Cole | 148/23 |

Primary Examiner—Peter D. Rosenberg
Attorney, Agent, or Firm—Charles D. Gunter, Jr.

[57] ABSTRACT

A no-clean, thermally dissipated soldering flux is shown which includes hydroabietal alcohol as a flux base, an organic activator and an organic diluent. The hydroabietal alcohol provides a tacky medium which holds a precisely aligned chip in place both during placement and reflow. The nature of the formula renders a reducing atmosphere unnecessary. The composition is thermally dissipated during soldering and leaves no undesirable residue which would require a post-cleaning step.

15 Claims, No Drawings

TACKY, NO-CLEAN THERMALLY DISSIPATED SOLDERING FLUX

BACKGROUND OF THE INVENTION

1. Field of the Invention

The present invention relates to soldering fluxes and their use in processes for soldering members, particularly metallic members together. The flux compositions of the invention are particularly useful in the field of microelectronics, such as in the preparation of integrated circuit modules and integrated circuit boards.

2. Description of the Prior Art

A common task in the manufacture of microelectronic components involves the manufacture of single chip or multi-chip modules having input/output pins which are inserted into a substrate. The input/output pins provide the needed electrical connections to the integrated circuit chip or chips which are subsequently connected to the substrate or carrier. In other presently known manufacturing processes, a chip is soldered directly to a printed circuit board. With either process, solder flux compositions have typically been applied to the pins in order to connect the component to the selected substrate, for instance, the printed circuit board. Flux compositions are employed to remove oxides from the pins and to prevent the pins from oxidizing when subjected to elevated temperatures for soldering, thereby serving to maintain the solderability of the pins. Once the solder is applied, any flux composition or residue remaining on the pins and substrates must be removed to provide as clean a substrate as possible In the past, this has meant that an extra step of flux removal was necessary in the manufacturing process.

The soldering operation, in general, and flux removal, in particular, is increasingly difficult when applied to microelectronics. The pieces to be joined are extremely small, making cleaning, tinning, post-cleaning and inspection difficult. In some cases, to avoid over heating, only the lead portion of the parts to be joined can be heated during the soldering operation. Cleaning and post-cleaning are difficult due to the small size of the component, their large numbers, and the potential damage to the electronics by the cleaning solutions used, if any. Another problem source results from the fact that many of the known soldering fluxes are corrosive. In the environment of microelectronics, corrosion from any residual flux can ruin an extremely costly device.

Many of the organic water soluble fluxes presently available contain corrosive materials such as halides. A flux composition which contains free halogen can result in conversion to hydroacids and corresponding halide ions by hydrolysis at the soldering temperature. Hydroacids can further react with organic materials present in the flux to free halide ions. Accordingly, if the flux residue is not entirely removed, it will lead to corrosion of the parts soldered.

Because of these problems, so-called "non-activated" rosin fluxes have been used in the past in the microelectronic environment in conjunction with a reducing atmosphere in the soldering equipment. This has not generally provided an acceptable solution, however, since the pure rosin alone is limited in oxide removal capability, can require rework to produce an acceptable product, and often a special soldering atmosphere and/or equipment is required.

To improve the pure rosin flux oxide removal capability, a number of "activated" or "mildly activated" rosin fluxes have been developed. These products have several shortcomings, including the necessity of a cleaning step to ensure the removal of corrosive agents left behind after the soldering operation. For instance, it was often necessary to employ specialized water-based detergents followed by a hot water rinse. These cleaning steps were extremely difficult during the assembly of chips to integrated circuit board where the low stand-off height of the chip to the substrate (typically 0.001 inches–0.004 inches) made it extremely difficult to clean underneath the chip with an aqueous or non-solvent process.

Other of the commercially available low residue fluxes which we have tested have proved to be too thin, running out from under the chip during the manufacturing operation and failing to hold it in place.

The present invention has as its object to provide a soldering flux which thermally dissipates during solder reflow so that no visible residue is left on the printed circuit substrate which would be visible with conventional inspection techniques such as light microscopy, or visual inspection.

Another object of the invention is to provide a "no cleaning" necessary flux which results in manufacturing cost savings and which is environmentally superior, requiring no chemical reclamation or waste treatment Another object of the invention is to provide a "soldering" flux having a novel flux base component which provides superior wetting properties and which provides a flux which remains tacky after application, holding a precisely aligned chip in proper position for up to 8 hours after placement and through reflow.

Another object is to provide a thermally dissipated soldering flux having the required activity to remove oxides present on the substrate without a reducing atmosphere to thereby promote adequate bonding.

Additional objects, features and advantages will be apparent in the following written description.

SUMMARY OF THE INVENTION

The thermally dissipated soldering flux of the invention has as its composition an ester of rosin which provides a tacky yet fluid medium as a flux base, a liquid solvent or diluent, such as isopropyl alcohol or other aliphatic alcohol having from about to 4 carbon atoms, and an organic activator composition, such as an aliphatic dicarboxylic acid. By combining these ingredients, a liquid solder flux is produced which remains tacky after application, holding a precisely aligned chip in position for reflow, and which is subsequently thermally dissipated leaving no visible residue which would require a cleaning step.

The method of the invention is used for fluxing the surface of a portion on a piece, such as the pin of an integrated circuit chip and/or the circuit pad of the substrate. The portion to be fluxed is contacted with the solder flux of the invention which most preferably consists essentially of a mixture of ester of rosin, an organic activator and an organic diluent. The contacted portion is then heated to a temperature at which the organic activator reacts with the oxides present on the surface of the portion of the piece and the solution evaporates leaving no residue.

In joining the chip to a substrate, such as a printed circuit board, the pin and a selected area on the substrate where solder has been previously applied, are fluxed using the composition of the invention. The chip and substrate are contacted and are joined at a temperature above the melting point of a metallic solder and then cooled to a temperature below the melting point of the solder, thereby joining the contacted portions together without any post-cleaning of the joined components.

The above as well as additional objects, features, and advantages of the invention will become apparent in the following detailed description.

DESCRIPTION OF THE INVENTION

The soldering flux compositions of the invention comprise: (1) an ester of rosin as the flux base, (2) an organic solvent or diluent and (3) an organic activator of the type which reacts with oxides present on the surface to be fluxed.

The ester of rosin which is used as the flux base of the present soldering flux is a special derivative of the family of rosins used in traditional rosin fluxes. It is a pure component that must be refined since it does not occur naturally in large quantities. It must possess the desired characteristics of forming a tacky vehicle, when combined with the organic activator and diluent in the desired proportions, and be effective to hold a chip or component in place for up to 8 hours after placement on a substrate, and through reflow. A particularly preferred ester of rosin is hydroabietal alcohol. Hydroabietal alcohol is a very tacky and extremely viscous substance that usually requires heating before it can be added to the other components of the flux. It will dissipate at temperatures above about 200° C. and will not carbonize up to a temperature of 340° C. which is appropriate to the temperature ranges for the reflow of solder.

It has the structural formulae:

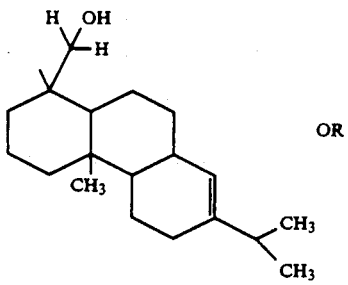

OR

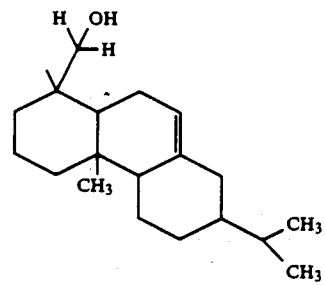

and is commercially available from Hercules Corporation of Wilmington, Del. as "ABITOL."

The ester of rosin component is employed in the composition of the present invention in the range from about 5 to about 30% by weight, based on the weight of the total flux composition.

The compositions of the present invention also contain an organic activator which is effective to remove oxides present on the surface to be fluxed and to improve wetting of the substrate. Preferably, the organic activator is ephemeral in nature, completely dissipating when heated in the range of about 200° C. and above. Preferred organic activators include, for example, abietic, adipic and citric acids as well as aliphatic dicarboxylic acids having about 2 to 6 carbon atoms. Each of the preferred activators is commercially available. For example, adipic acid is a white crystalline solid having a molecular weight of approximately 146.14 and a melting point of 153° C. It is found naturally in beet juice and can be prepared by oxidizing cyclohexanol with concentrated nitric acid. It is commonly available from Aldrich Chemical Company, Inc., Sigma Chemical Company and Eastman Kodak Company.

The organic activator component of the soldering fluxes of the invention is preferably present in the range from about 1 to 6% by weight of the total flux composition.

The compositions of the present invention also contain at least one organic solvent or diluent which will evaporate or dissipate during the reflow operation. A variety of evaporative organic solvents are known, the preferred diluent being an aliphatic alcohol having about 1 to 4 carbon atoms, i.e., methyl alcohol, ethyl alcohol, isopropyl alcohol, n-propyl alcohol, isobutyl alcohol and n-butyl alcohol. Other organic solvents which are known to be operative include tetrahydrofuran, acetone, ethyl acetate, ethyl formate, hexane, gamma-butyrolactone, xylene, cyclohexanone, t-butyl alcohol, and mixtures thereof. The aliphatic alcohols are preferred because of the absence of objectional odors, the absence of adverse reaction to the other ingredients and because of the lack of environmental and health concerns.

The organic diluent component of the solder fluxes of the invention is present in the range from about 64 to 94% by weight of the total flux composition.

The following non-limited example is a preferred formulation of the thermally dissipated, noclean soldering flux of the invention:

| Component | Weight % |
|---|---|
| Hydroabietal alcohol* | 5-30 |
| organic activator (abietic, adipic, citric acid) | 1-6 |
| diluent (isopropyl alcohol) | 64-94 |

*must be heated before pouring due to extremely high viscosity.

An invention has been provided with several advantages. The soldering flux of the invention is thermally dissipated during use and leaves no visible residue which would require a post-cleaning operation. The soldering flux exhibits superior wettability, producing the activity needed to effectively remove oxides on the surface to be fluxed. The hydroabietal alcohol component provides a tacky yet fluid medium which holds a precisely aligned chip in place for up to 8 hours after placement and during solder reflow. The composition exhibits no corrosivity even if left on a card for a period of time before or after the soldering operation. The only by-products of the flux of the invention are inert and leave no undesirable residue. The compositions can be formulated without the use of chemicals which are environmental and/or health hazards.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

What is claimed is:

1. A thermally dissipated no-clean soldering flux adapted for use in assembling chips to integrated circuit boards, where the stand off height of the chips to the boards is on the order of about 0.001 to 0.004 inches, the flux comprising:

from about 5 to about 30% by weight based on the total weight of the flux of a pure ester of rosin as a flux base;

from about 1 to 6 % by weight based on the total weight of the flux of an organic activator;

the remainder being substantially at least one organic diluent;

wherein the flux is thermally dissipated, in use, leaving no visible or corrosive residue which would require a post-cleaning step; and wherein the flux has a characteristic activity and, due to its activity, does not require a reducing atmosphere during the soldering process.

2. The thermally dissipated soldering flux of claim 1, wherein said organic activator is an aliphatic dicarboxylic acid having about 2 to 6 carbon atoms.

3. The thermally dissipated soldering flux of claim 1, wherein said organic activator is selected from the group consisting of abietic, adipic or citric acid.

4. The thermally dissipated soldering flux of claim 1, wherein said organic diluent is an aliphatic alcohol having about 1 to 4 carbon atoms.

5. The thermally dissipated soldering flux of claim 4, wherein said organic diluent is selected from the group consisting of methyl alcohol, ethyl alcohol, isopropyl alcohol, isobutyl alcohol and n-butyl alcohol.

6. The thermally dissipated soldering flux of claim 1, wherein the said flux base is hydroabietal alcohol.

7. A method of fluxing the surface of a portion on a piece, comprising the steps of:

furnishing a piece to be fluxed;

contacting the portion to be fluxed with a solution consisting essentially of a mixture of about 5 to 30% by weight pure ester of rosin as a flux base, from about 1 to 6% of an organic activator, and an organic diluent; and heating the contacted portion to a temperature at which the organic activator reacts with oxides present on the surface and the solution evaporates.

8. The method of claim 7, wherein the flux base is hydroabietal alcohol.

9. The method of claim 8, wherein the organic activator employed is selected from the group consisting of abietic acid, adipic acid and citric acid.

10. The method of claim 7, wherein the organic diluent is an aliphatic alcohol having about 1 to 4 carbon atoms.

11. The method of claim 10, wherein the organic diluent is selected from the group consisting of methyl alcohol, ethyl alcohol, isopropyl alcohol, n-propyl alcohol, isobutyl alcohol and n-butyl alcohol.

12. A method for joining portions of two pieces, comprising the steps of:

furnishing the two pieces to be joined at least one of which has had a metallic solder previously applied;

contacting the portions to be joined to a solution consisting essentially of about 5 to 30% by weight hydroabietal alcohol as a flux base, about 1 to 6% by weight of an acid activator and the remainder being an alcohol diluent;

contacting the two portions to be joined at a temperature above the melting point of the metallic solder and then cooling the contacted portions to a temperature below the melting point of the metallic solder, thereby joining the contacted portions together, the method being carried out without any ost-cleaning of the joined components.

13. The method of claim 12, wherein at least one of the pieces that is in an electronic component.

14. The method of claim 12, wherein one of said pieces is an electronic chip and one of said pieces is a printed circuit board.

15. A thermally dissipated no-clean soldering flux consisting essentially of:

from about 5 to 30% by weight hydroabietal alcohol as a flux base;

from about 1 to 6% by weight of an organic activator selected from the group consisting of abietic acid and aliphatic dicarboxylic acids having about 2 to 6 carbon atoms in the carbon chain;

the remainder being an organic diluent; and wherein the flux is characterized as being thermally dissipated, in use, leaving no visible residue which would require a post-cleaning step.

* * * * *

UNITED STATES PATENT AND TRADEMARK OFFICE
CERTIFICATE OF CORRECTION

PATENT NO. : 5,129,962

DATED : July 14, 1992

INVENTOR(S) : Gutierrez et al.

It is certified that error appears in the above-identified patent and that said Letters Patent is hereby corrected as shown below:

Column 6, line 33, change "ost-cleaning" to --post-cleaning--

Signed and Sealed this

Ninth Day of November, 1993

*Attest:*

BRUCE LEHMAN

*Attesting Officer*     *Commissioner of Patents and Trademarks*